United States Patent
Suto et al.

(10) Patent No.: US 11,594,381 B2
(45) Date of Patent: *Feb. 28, 2023

(54) LAMINATE PRODUCTION METHOD, AND DYE-SENSITIZED SOLAR CELL PRODUCTION METHOD

(71) Applicant: JFE Steel Corporation, Tokyo (JP)

(72) Inventors: Mikito Suto, Tokyo (JP); Hiroyuki Masuoka, Tokyo (JP); Akira Matsuzaki, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 17/294,823

(22) PCT Filed: Dec. 9, 2019

(86) PCT No.: PCT/JP2019/048096
§ 371 (c)(1),
(2) Date: May 18, 2021

(87) PCT Pub. No.: WO2020/122019
PCT Pub. Date: Jun. 18, 2020

(65) Prior Publication Data
US 2021/0407738 A1   Dec. 30, 2021

(30) Foreign Application Priority Data
Dec. 12, 2018 (JP) .............................. JP2018-232755

(51) Int. Cl.
| | |
|---|---|
| H01L 21/00 | (2006.01) |
| H01G 9/20 | (2006.01) |
| C23C 14/08 | (2006.01) |
| C23C 14/34 | (2006.01) |
| C23C 28/04 | (2006.01) |
| C25D 9/08 | (2006.01) |
| H01G 9/00 | (2006.01) |

(52) U.S. Cl.
CPC ......... *H01G 9/2031* (2013.01); *C23C 14/086* (2013.01); *C23C 14/34* (2013.01); *C23C 28/04* (2013.01); *C25D 9/08* (2013.01); *H01G 9/0029* (2013.01)

(58) Field of Classification Search
CPC . H01L 51/448; H01L 51/4213; H01L 51/442; H01L 51/0002; H01L 51/4226; H01L 51/44; H01L 51/0007; Y02E 10/542; Y02E 10/549; H01G 9/2031; Y02P 70/50; C01G 23/04

See application file for complete search history.

(56) References Cited

U.S. PATENT DOCUMENTS

| | | | |
|---|---|---|---|
| 7,977,131 B2 | 7/2011 | Asano et al. | |
| 2010/0269894 A1 | 10/2010 | Misra et al. | |
| 2013/0327386 A1* | 12/2013 | Xu ........................ | H01G 9/2036 |
| | | | 136/256 |
| 2020/0131645 A1 | 4/2020 | Suto et al. | |

FOREIGN PATENT DOCUMENTS

| | | |
|---|---|---|
| JP | 2005108807 A | 4/2005 |
| JP | 2017082295 A | 5/2017 |
| WO | 2012073010 A1 | 6/2012 |
| WO | 2018225861 A1 | 12/2018 |

OTHER PUBLICATIONS

Chigane ("Preparation of Hollow Titanium Dioxide Shell Thin Films by Electrophoresis and Electrolysis for Dye-Sensitized Solar Cells") , Electrochemical and Solid-State Letters, 12 5 E5-E8 2009 (Year: 2009).*
Chigane-2 ("Titanium dioxide thin films prepared by electrolysis from aqueous solution of titanium-lactic aced complex for dye-sensitized solar cells"), Thin Solid Films 520 (2012) 3510-3514 (Year: 2012).*
Chigane et al., "Preparation of Hollow Titanium Dioxide Shell Thin Films by Electrophoresis and Electrolysis for Dye-Sensitized Solar Cells", Electrochemical and Solid-State Letters, vol. 12, No. 5, pp. E5-E8, Feb. 27, 2009.
Extended European Search Report for European Application No. 19 896 508.9, dated Feb. 7, 2022, 9 pages.
Rusop et al., "Copper Iodide Thin Films as a p-Type Electrical Conductivity in Dye-sensitized p-CuI/Dye/n-TiO2 Heterojunction Solid State Solar Cells", Surface Review and Letters, vol. 11, No. 6, Dec. 25, 2004, pp. 577-583.
Taiwanese Office Action for Taiwanese Application No. 108145358, dated Feb. 16, 2022, with Concise Statement of Relevance of Office Action, 8 pages.
International Search Report and Written Opinion for International Application No. PCT/JP2019/048096, dated Feb. 10, 2020, 7 pages.
Chigane et al., "Preparation of Hollow Titanium Dioxide Shell Thin Films from Aqueous Solution of Ti-Lactate Complex for Dye-Sensitized Solar Cells", Solar Cells—Dye-Sensitized Devices, Nov. 2011, 17 pages.
Chigane et al., "Titanium dioxide thin films prepared by electrolysis from aqueous solution of titanium-lactic acid complex far dye-sensitized solar cells", Thin Solid Film, 2012, pp. 3510-3514.
Japanese Office Action for Japanese Application No. 2020-516933, dated Feb. 2, 2021, with Concise Statement of Relevance, 5 pages.

(Continued)

*Primary Examiner* — Angelo Trivisonno
(74) *Attorney, Agent, or Firm* — RatnerPrestia

(57) ABSTRACT

The present invention provides a novel method for producing a laminate to be used as a light-transmissive electrode layer and an N-type semiconductor layer of a wet or solid-state dye-sensitized solar cell comprising a light-transmissive electrode layer, an N-type semiconductor layer, a P-type semiconductor layer, and a facing electrode in this order. In said method, a member to be used as the light-transmissive electrode layer is cathode-polarized in a treatment solution containing a Ti component so as to form a titanium oxide layer to be used as the N-type semiconductor layer on said member.

16 Claims, No Drawings

(56) References Cited

OTHER PUBLICATIONS

Taiwanese Office Action for Japanese Application No. 108145358, dated Jul. 15, 2020, with Concise Statement of Relevance, 7 pages.
Taiwanese Office Action for Japanese Application No. 108145358, dated Oct. 26, 2020, with Concise Statement of Relevance, 7 pages.
Non Final Office Action for U.S. Appl. No. 17/297,160, dated Jul. 19, 2022, 21 pages.

* cited by examiner

LAMINATE PRODUCTION METHOD, AND DYE-SENSITIZED SOLAR CELL PRODUCTION METHOD

CROSS REFERENCE TO RELATED APPLICATIONS

This is the U.S. National Phase application of PCT/JP2019/048096, filed Dec. 9, 2019, which claims priority to Japanese Patent Application No. 2018-232755, filed Dec. 12, 2018, the disclosures of these applications being incorporated herein by reference in their entireties for all purposes.

FIELD OF THE INVENTION

The present invention relates to a laminate producing method and a dye-sensitized solar cell producing method.

BACKGROUND OF THE INVENTION

Conventionally, a dye-sensitized solar cell is known (see Patent Literature 1).

A dye-sensitized solar cell is a wet-type or solid-state dye-sensitized solar cell and includes, for instance, a light-transmissive electrode layer, an N-type semiconductor layer, a P-type semiconductor layer and a counter electrode layer in this order.

PATENT LITERATURE

Patent Literature 1: JP 2005-108807 A

SUMMARY OF THE INVENTION

As described above, a dye-sensitized solar cell is a wet-type or solid-state dye-sensitized solar cell and includes, for instance, a light-transmissive electrode layer, an N-type semiconductor layer, a P-type semiconductor layer and a counter electrode layer in this order.

An object according to aspects of the present invention is to provide a new method for producing a laminate that becomes a light-transmissive electrode layer and an N-type semiconductor layer of such a dye-sensitized solar cell.

The present inventors have made an intensive study and as a result found that when the configuration described below is employed, the foregoing object is achieved. Aspects of the invention have been thus completed.

Specifically, aspects of the present invention provide the following [1] to [5].

[1] A laminate producing method for producing a laminate that becomes a light-transmissive electrode layer and an N-type semiconductor layer of a wet-type or solid-state dye-sensitized solar cell including the light-transmissive electrode layer, the N-type semiconductor layer, a P-type semiconductor layer and a counter electrode layer in this order, the method comprising:

subjecting a member serving as the light-transmissive electrode layer to cathode polarization in a treatment solution containing a Ti component to thereby form, on the member, a titanium oxide layer that becomes the N-type semiconductor layer.

[2] The laminate producing method according to [1] above, wherein a Ti content of the treatment solution is not less than 0.004 mol/L and not more than 1.300 mol/L.

[3] The laminate producing method according to [1] or [2] above, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

[4] The laminate producing method according to any one of [1] to [3] above, wherein current is applied at a current density of not less than 0.01 A/dm$^2$ and less than 1.00 A/dm$^2$ with the member serving as the light-transmissive electrode layer being used as a cathode.

[5] A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to any one of [1] to [4] above.

Aspects of the present invention make it possible to provide a new method for producing a laminate that becomes a light-transmissive electrode layer and an N-type semiconductor layer of a dye-sensitized solar cell.

DETAILED DESCRIPTION OF EMBODIMENTS OF THE INVENTION

[Dye-Sensitized Solar Cell]

First, a dye-sensitized solar cell is described.

A dye-sensitized solar cell is a wet-type or solid-state dye-sensitized solar cell and includes, for instance, a light-transmissive electrode layer, an N-type semiconductor layer, a P-type semiconductor layer and a counter electrode layer in this order.

The thickness and the like of each layer are appropriately specified.

An example of the light-transmissive electrode layer is a conductive metal oxide film such as an ITO (Indium Tin Oxide) film or an FTO (Fluorine-doped Tin Oxide) film. The light-transmissive electrode layer may be disposed on a transparent substrate such as a glass substrate or a resin film.

An example of the N-type semiconductor layer is a titanium oxide layer containing titanium oxide ($TiO_2$) onto which a dye is adsorbed. Examples of the dye include a Ru-based dye and a coumarin-based dye.

An exemplary material for the P-type semiconductor layer is CuI.

Examples of the counter electrode layer include an ITO electrode layer and an FTO electrode layer.

[Laminate Producing Method]

Roughly speaking, a laminate producing method according to aspects of the invention is a method for producing a laminate that becomes the light-transmissive electrode layer and the N-type semiconductor layer of the dye-sensitized solar cell described above.

To be more specific, a member serving as the light-transmissive electrode layer is subjected to cathode polarization in a treatment solution containing a Ti component. That is, current is applied with the member serving as the light-transmissive electrode layer being used as the cathode. Consequently, a titanium oxide layer that becomes the N-type semiconductor layer is formed on the member serving as the light-transmissive electrode layer. For the counter electrode, an insoluble electrode such as a platinum electrode is suitable.

It is presumed that the titanium oxide layer is formed as follows. First, upon generation of hydrogen, the pH increases at the surface of the member serving as the light-transmissive electrode layer. As a result, when the Ti component in the treatment solution is hexafluorotitanic acid and/or its salt for instance, hexafluorotitanic acid ions in the treatment solution generate titanium hydroxide while being defluorinated. This titanium hydroxide adheres to the surface of the member serving as the light-transmissive electrode layer, and through subsequent washing and dehydration condensation by drying or the like, the titanium oxide layer is formed. However, any other mechanisms than the foregoing are also regarded as being within the scope of the invention.

The member serving as the light-transmissive electrode layer is preferably a member having electrical conductivity, e.g., a conductive metal oxide film such as an ITO film or an FTO film.

The member serving as the light-transmissive electrode layer may be disposed on a transparent substrate such as a glass substrate or a resin film. In this case, the transparent substrate having the member serving as the light-transmissive electrode layer (e.g., an ITO film-bearing glass substrate) is subjected to cathode polarization. In this case, the resulting laminate is to include this transparent substrate.

The treatment solution contains a Ti component (Ti compound) for supplying Ti (elemental titanium) to the titanium oxide layer to be formed.

As the Ti component, preferred is at least one selected from the group consisting of hexafluorotitanic acid ($H_2TiF_6$), potassium hexafluorotitanate ($K_2TiF_6$), sodium hexafluorotitanate ($Na_2TiF_6$), ammonium hexafluorotitanate (($NH_4)_2TiF_6$), ammonium titanyl oxalate (($NH_4)_2[TiO(C_2O_4)_2]$), potassium titanyl oxalate dihydrate ($K_2[TiO(C_2O_4)_2] \cdot 2H_2O$), titanium sulfate ($Ti(SO_4)_2$), and titanium lactate ($Ti(OH)_2[OCH(CH_3)COOH]_2$).

Of these, hexafluorotitanic acid and/or its salts (potassium hexafluorotitanate, sodium hexafluorotitanate, ammonium hexafluorotitanate) are preferred for the sake of stability of the treatment solution, availability, and other factors.

The Ti content of the treatment solution is preferably not less than 0.004 mol/L, more preferably not less than 0.010 mol/L, and even more preferably not less than 0.020 mol/L.

At the same time, the Ti content of the treatment solution is preferably not more than 1.300 mol/L, more preferably not more than 1.000 mol/L, even more preferably not more than 0.700 mol/L, particularly preferably not more than 0.300 mol/L, and most preferably not more than 0.150 mol/L.

Water is used as a solvent of the treatment solution.

The pH of the treatment solution is not particularly limited and is for example 2.0 to 5.0. Known acid components (e.g., phosphoric acid, sulfuric acid) or alkaline components (e.g., sodium hydroxide, ammonia water) may be used for pH adjustment.

The treatment solution may optionally contain a surfactant such as sodium lauryl sulfate or acetylenic glycol. The treatment solution may also contain condensed phosphate such as pyrophosphate for the sake of stability of deposition behavior over time.

The treatment solution has a temperature preferably of 20° C. to 80° C. and more preferably of 40° C. to 60° C.

The treatment solution may further contain a conduction aid.

Exemplary conduction aids include: sulfates such as potassium sulfate, sodium sulfate, magnesium sulfate and calcium sulfate; nitrates such as potassium nitrate, sodium nitrate, magnesium nitrate and calcium nitrate; and chloride salts such as potassium chloride, sodium chloride, magnesium chloride and calcium chloride.

The conduction aid content of the treatment solution is preferably 0.010 to 1.000 mol/L and more preferably 0.020 to 0.500 mol/L.

The current density during cathode polarization is preferably not less than 0.01 $A/dm^2$, more preferably not less than 0.10 $A/dm^2$, and even more preferably not less than 0.20 $A/dm^2$.

At the same time, the current density during cathode polarization is preferably less than 1.00 $A/dm^2$, more preferably not more than 0.80 $A/dm^2$, and even more preferably not more than 0.60 $A/dm^2$.

The current application time is suitably specified and is for example 5 to 60 seconds and preferably 10 to 40 seconds.

Cathode polarization may be followed by washing with water.

The washing method is not particularly limited, and one exemplary method is immersion in water after cathode polarization. The temperature of water (water temperature) for use in washing is preferably 40° C. to 90° C.

The washing time is preferably more than 0.5 seconds and preferably 1.0 to 5.0 seconds.

Further, drying may replace or follow the washing with water. The temperature and the method of drying are not particularly limited, and a drying process using a typical drier or electric furnace may be employed for example. The drying temperature is preferably not higher than 100° C.

[Dye-Sensitized Solar Cell Producing Method]

A dye-sensitized solar cell producing method according to aspects of the invention is a method for producing a wet-type or solid-state dye-sensitized solar cell including a light-transmissive electrode layer, an N-type semiconductor layer, a P-type semiconductor layer and a counter electrode layer in this order by using the laminate obtained by the laminate producing method according to aspects of the invention described above.

For example, first, the laminate obtained by the laminate producing method according to aspects of the invention is immersed in a solution containing a dye, e.g., a Ru-based dye, such that the dye is adsorbed onto titanium oxide constituting the titanium oxide layer of the laminate, whereby the titanium oxide layer becomes an N-type semiconductor layer.

Subsequently, a P-type semiconductor layer and a counter electrode layer are sequentially formed on the N-type semiconductor layer. For instance, a CuI solution is dropped onto the N-type semiconductor layer to thereby form the P-type semiconductor layer, and an ITO electrode layer or the like is, as the counter electrode layer, disposed on the formed P-type semiconductor layer.

The methods for forming the respective layers are not limited to the foregoing methods, and known methods may be suitably used.

EXAMPLES

Aspects of the present invention are specifically described below with reference to examples. However, the present invention is not limited thereto.

<Preparation of Member Serving as Light-Transmissive Electrode Layer>

Prepared was an ITO film-bearing glass substrate (manufactured by Ideal Star Inc.) having an ITO (Indium Tin Oxide) film laminated on one surface of a glass substrate (30 mm×35 mm, thickness: 0.7 mm) by sputtering. This ITO film-bearing glass substrate was used as a transparent substrate having a member serving as the light-transmissive electrode layer.

<Production of Laminate That Becomes Light-Transmissive Electrode Layer and N-Type Semiconductor Layer>

A laminate that becomes the light-transmissive electrode layer and the N-type semiconductor layer was produced using the prepared ITO film-bearing glass substrate (the transparent substrate having the member serving as the light-transmissive electrode layer) in the following manner.

First, prepared was a treatment solution containing 0.040 mol/L of potassium hexafluorotitanate ($K_2TiF_6$) and 0.10 mol/L of potassium sulfate ($K_2SO_4$) and having the pH adjusted to 4.0 by use of potassium hydroxide (hereinafter simply called "treatment solution").

Next, the prepared ITO film-bearing glass substrate was immersed in a cleaning solution having Semiclean M-4 (manufactured by Yokohama Oils & Fats Industry Co., Ltd.) diluted by 20 times with ion exchanged water, and subjected to ultrasonic cleaning for 10 minutes. Thereafter, the ITO film-bearing glass substrate was taken out from the cleaning solution, immersed in ion exchanged water, and subjected to ultrasonic cleaning for 10 minutes.

The cleaned ITO film-bearing glass substrate was immersed in the prepared treatment solution (solution temperature: 50° C.). The ITO film-bearing glass substrate was subjected to cathode polarization in the treatment solution under the conditions of a current density of 0.40 A/dm$^2$ and a current application time of 20 seconds. Then, the ITO film-bearing glass substrate was immersed in a water bath at 25° C. for 2.0 seconds for washing with water, and then dried by a blower at room temperature. Thus, a titanium oxide layer that becomes the N-type semiconductor layer with a thickness of about 50 nm was formed on the ITO film of the ITO film-bearing glass substrate. The ITO film-bearing glass substrate having the titanium oxide layer formed thereon (a laminate that becomes the light-transmissive electrode layer and the N-type semiconductor layer) was produced in this manner.

<Production of Dye-Sensitized Solar Cell>

A dye-sensitized solar cell was produced using the produced laminate, as follows.

First, a Ru complex (manufactured by Aldrich) was dissolved in chloroform at a concentration of $2.8 \times 10^{-4}$ mol/L to prepare a Ru complex solution. The ITO film-bearing glass substrate having the titanium oxide layer formed thereon was immersed in the prepared Ru complex solution for 30 hours and then dried. This process allows a dye constituted of the Ru complex (Ru-based dye) to adsorb onto titanium oxide contained in the titanium oxide layer. Thus, the titanium oxide layer became the N-type semiconductor layer.

Next, a CuI solution was dropped onto the titanium oxide layer having the Ru-based dye adsorbed thereon (N-type semiconductor layer) to thereby form the P-type semiconductor layer.

Then, an ITO electrode layer (30 mm×35 mm) serving as the counter electrode layer was disposed on the P-type semiconductor layer.

Thus, a solid-state dye-sensitized solar cell in which the ITO film (light-transmissive electrode layer), the titanium oxide layer having the dye adsorbed thereon (N-type semiconductor layer), the P-type semiconductor layer, and the ITO electrode layer (counter electrode layer) were stacked in this order on one surface of the glass substrate, was produced.

<Evaluation on Dye-Sensitized Solar Cell>

The following evaluation was conducted with the produced dye-sensitized solar cell with atmospheric sealing.

The dye-sensitized solar cell was irradiated, from its ITO film side, with artificial sunlight having a spectrum distribution of AM 1.5G and a light intensity of 100 mW/cm$^2$ by use of a solar simulator (XES-502S, manufactured by SAN-EI Electric Co., Ltd.). In this state, a photocurrent-voltage profile of the dye-sensitized solar cell was measured with a linear sweep voltammetry (LSV) measurement device (HZ-5000, manufactured by Hokuto Denko Corporation).

From this profile, those values were calculated: short-circuit current (absolute value, Jsc): 8.27 mA/cm$^2$, open-circuit voltage (Voc): 0.545 V, fill factor (FF): 0.57, and power conversion efficiency (PCE): 2.56%.

The invention claimed is:

1. A laminate producing method for producing a laminate that becomes a light-transmissive electrode layer and an N-type semiconductor layer of a wet-type or solid-state dye-sensitized solar cell including the light-transmissive electrode layer, the N-type semiconductor layer, a P-type semiconductor layer and a counter electrode layer in this order, the method comprising:
    subjecting a member serving as the light-transmissive electrode layer to cathode polarization in a treatment solution containing a Ti component to thereby form, on the member serving as the light-transmissive electrode layer, a titanium oxide layer that becomes the N-type semiconductor layer,
    wherein polystyrene sphere particles are not adsorbed on the member serving as the light-transmissive electrode layer before subjecting the member serving as the light-transmissive electrode layer to cathode polarization.

2. The laminate producing method according to claim 1, wherein a Ti content of the treatment solution is not less than 0.004 mol/L and not more than 1.300 mol/L.

3. The laminate producing method according to claim 1, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

4. The laminate producing method according to claim 2, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

5. The laminate producing method according to claim 1, wherein current is applied at a current density of not less than 0.01 A/dm$^2$ and less than 1.00 A/dm$^2$ with the member serving as the light-transmissive electrode layer being used as a cathode.

6. The laminate producing method according to claim 2, wherein current is applied at a current density of not less than 0.01 A/dm$^2$ and less than 1.00 A/dm$^2$ with the member serving as the light-transmissive electrode layer being used as a cathode.

7. The laminate producing method according to claim 3, wherein current is applied at a current density of not less than 0.01 A/dm$^2$ and less than 1.00 A/dm$^2$ with the member serving as the light-transmissive electrode layer being used as a cathode.

8. The laminate producing method according to claim 4, wherein current is applied at a current density of not less than 0.01 A/dm$^2$ and less than 1.00 A/dm$^2$ with the member serving as the light-transmissive electrode layer being used as a cathode.

9. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 1.

10. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 2.

11. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 3.

12. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 4.

13. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 5.

14. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 6.

15. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 7.

16. A dye-sensitized solar cell producing method for producing a wet-type or solid-state dye-sensitized solar cell including a light-transmissive electrode layer, an N-type semiconductor layer, a P-type semiconductor layer and a counter electrode layer in this order by using a laminate obtained by the laminate producing method according to claim 8.

* * * * *